US012607677B2

(12) United States Patent
Jeon et al.

(10) Patent No.: US 12,607,677 B2
(45) Date of Patent: Apr. 21, 2026

(54) BATTERY ANALYSIS APPARATUS AND METHOD

(71) Applicant: LG ENERGY SOLUTION, LTD., Seoul (KR)

(72) Inventors: Jae Kwang Jeon, Daejeon (KR); Young Chang Jo, Daejeon (KR); Sung Yul Yoon, Daejeon (KR); Jeong Bin Lee, Daejeon (KR); Jae Sung Im, Daejeon (KR); Won Kyung Kim, Daejeon (KR); Won Bin Choi, Daejeon (KR); Myung Hyun Shim, Daejeon (KR)

(73) Assignee: LG ENERGY SOLUTION, LTD., Seoul (KR)

( * ) Notice: Subject to any disclaimer, the term of this patent is extended or adjusted under 35 U.S.C. 154(b) by 604 days.

(21) Appl. No.: 17/715,689

(22) Filed: Apr. 7, 2022

(65) Prior Publication Data

US 2022/0268843 A1 Aug. 25, 2022

(30) Foreign Application Priority Data

Feb. 19, 2021 (KR) ........................ 10-2021-0022873

(51) Int. Cl.
G01R 31/367 (2019.01)

(52) U.S. Cl.
CPC .................................. G01R 31/367 (2019.01)

(58) Field of Classification Search
CPC .................................................... G01R 31/367
See application file for complete search history.

(56) References Cited

U.S. PATENT DOCUMENTS

| | | | | |
|---|---|---|---|---|
| 9,256,485 B1* | 2/2016 | Moore | ...................... | G06F 8/34 |
| 2005/0057100 A1* | 3/2005 | Crusius | ................... | H02J 9/061 |
| | | | | 307/66 |
| 2008/0052730 A1* | 2/2008 | Webb | ...................... | G06F 8/433 |
| | | | | 719/331 |
| 2011/0133721 A1* | 6/2011 | Tsujiko | ................... | B60L 53/14 |
| | | | | 180/65.21 |
| 2013/0162037 A1* | 6/2013 | Kim | ....................... | H02J 3/381 |
| | | | | 307/24 |
| 2015/0005839 A1* | 1/2015 | Sabesan | ............. | A61N 1/36178 |
| | | | | 607/45 |
| 2019/0165580 A1* | 5/2019 | Doherty | ............... | G05B 13/042 |
| 2019/0199095 A1* | 6/2019 | Kim | .......................... | H02J 3/32 |

FOREIGN PATENT DOCUMENTS

| | | | | | |
|---|---|---|---|---|---|
| CN | 101022178 A | * | 8/2007 | | |
| CN | 102721931 B | | 7/2014 | | |
| CN | 103955766 A | * | 7/2014 | | |
| CN | 110389234 A | * | 10/2019 | ............. | G01F 21/02 |
| CN | 111064245 A | | 4/2020 | | |

(Continued)

*Primary Examiner* — Michael J Dalbo
*Assistant Examiner* — Kaleria Knox
(74) *Attorney, Agent, or Firm* — Birch, Stewart, Kolasch & Birch, LLP

(57) ABSTRACT

A battery analysis apparatus includes a site information generating unit for generating information of an energy storage system (ESS) site, a data collecting unit for collecting state data of at least one battery included in the ESS site, and an analyzing unit for analyzing a state of the battery based on the state data of the battery.

15 Claims, 10 Drawing Sheets

(56) References Cited

FOREIGN PATENT DOCUMENTS

| | | | | | |
|---|---|---|---|---|---|
| EP | 3 961 595 | A1 | | 3/2022 | |
| KR | 20110123301 | | * | 11/2011 | ........... G06F 1/3234 |
| KR | 10-2012-0088064 | A | | 8/2012 | |
| KR | 10-1692694 | B1 | | 1/2017 | |
| KR | 10-1951538 | B1 | | 2/2019 | |
| KR | 10-1954889 | B1 | | 3/2019 | |
| KR | 10-2020-0029662 | A | | 3/2020 | |
| KR | 10-2165528 | B1 | | 10/2020 | |
| KR | 10-2020-0136733 | A | | 12/2020 | |
| KR | 10-2021-0001172 | A | | 1/2021 | |
| KR | 20210001172 | A | * | 1/2021 | .............. H01J 3/001 |

* cited by examiner

100

NEW SITE DB REGISTRATION ~310

ESS SITE LOG DATA
SEQUENTIAL INQUIRY ~320

DATA PRE-PROCESSING,
LOG DATA DB GENERATION ~330

ANALYSIS THROUGH MCR ~340

1000

BATTERY ANALYSIS APPARATUS AND METHOD

CROSS REFERENCE TO RELATED APPLICATION

The present application claims priority to Korean Patent Application No. 10-2021-0022873, filed Feb. 19, 2021, the entire contents of which is incorporated herein for all purposes by this reference.

BACKGROUND OF THE INVENTION

Field of the Invention

Embodiments disclosed herein relate to a battery analysis apparatus and method.

Description of the Related Art

Secondary batteries are generally used as battery racks including a battery module where a plurality of battery cells are connected to one another in series and/or in parallel. The battery rack may be managed and controlled by a battery management system in terms of a state and an operation. Recently, a data processing and analysis system has been used, which remotely collects log data about a state of a battery from an energy storage system (ESS) at specific intervals, pre-processes the collected data, and then derives an analysis result through an analysis algorithm.

In such a system, a process of generating information of an ESS site where the ESS is installed, a process of pre-processing and analyzing the log data of the battery, etc., are manually performed by manpower. However, as the number of ESS sites increases, it is inevitably difficult to keep up with an increasing data rate, with a data processing and analysis method that relies on manpower. Moreover, in an existing system, a personal computer (PC) for registering an ESS site and a PC for processing and analyzing log data of a battery are separated from each other, resulting in a limitation in which efficiency is degraded in a process of transmitting and downloading data.

SUMMARY OF THE INVENTION

The present disclosure is proposed to solve these problems and aims to provide a battery analysis apparatus and method in which one system processes and analyzes log data about a state of a battery and automates respective processes, thereby accommodating data increasing with expansion of an ESS site and rapidly and efficiently processing and analyzing log data of the battery.

Technical problems of the embodiments disclosed herein are not limited to the above-described technical problems, and other unmentioned technical problems would be clearly understood by one of ordinary skill in the art from the following description.

A battery analysis apparatus according to an embodiment disclosed herein includes a site information generating unit configured to generate information of an energy storage system (ESS) site, a data collecting unit configured to collect state data of a battery included in the ESS site, and an analyzing unit configured to analyze a state of the battery based on the state data of the battery.

According to an embodiment, the battery analysis apparatus may further include a data processing unit configured to perform pre-processing on the state data of the battery.

According to an embodiment, the data processing unit may be further configured to perform a preset operation through an auto-running file.

According to an embodiment, the data processing unit may be further configured to automatically perform pre-processing on the state data of the battery by using a matlab compiler runtime (MCR) file.

According to an embodiment, the data processing unit may be further configured to perform a preset operation by executing the MCR file according to a period set by a scheduler and an order set by a batch file.

According to an embodiment, the data processing unit may be configured to perform the pre-processing on the state data of the battery through at least one of time reversal removal, redundant data removal, time unit setting, and file format transformation.

According to an embodiment, the analyzing unit may be further configured to perform a preset operation through an auto-running file.

According to an embodiment, the analyzing unit may be configured to automatically analyze the state of the battery using a matlab compiler runtime (MCR) file.

According to an embodiment, the analyzing unit may be further configured to perform a preset operation by executing the MCR file according to a period set by a scheduler and an order set by a batch file.

According to an embodiment, the site information generating unit may be further configured to automatically update information of the ESS site each time when the ESS site is added.

According to an embodiment, the information of the ESS site may include information about a number of batteries included in each ESS site and structures of the batteries included in each ESS site.

According to an embodiment, the site information generating unit may be configured to generate the information of the ESS site through a command prompt (CMD) or a batch file.

According to an embodiment, the site information generating unit may be further configured to generate a folder for each identification (ID) of the ESS site and store the information of the ESS site in each folder.

According to an embodiment, the data collecting unit may be configured to automatically collect the state data of the battery from the ESS site through a batch file.

According to an embodiment, the analyzing unit may be configured to further calculate charging/discharging behaviors of the battery based on the state data of the battery and extract the battery having the charging/discharging behaviors falling out of a reference range to classify an abnormality type.

A battery analysis method according to an embodiment disclosed herein includes generating information of an energy storage system (ESS) site, collecting state data of a battery included in the ESS site, and analyzing a state of the battery based on the state data of the battery.

According to an embodiment, the battery analysis method may further include performing pre-processing on the state data of the battery.

According to an embodiment, the performing of pre-processing on the state data of the battery and the analyzing of the state of the battery may include performing a preset operation through an auto-running file.

According to an embodiment, the performing of pre-processing on the state data of the battery may include automatically performing pre-processing on the state data of the battery by using a matlab compiler runtime (MCR) file, 3
4 and the analyzing of the state of the battery may include automatically analyzing the state of the battery by using the MCR file.

According to an embodiment, the performing of pre-processing on the state data of the battery and the analyzing of the state of the battery may include performing a preset operation by executing the MCR file according to a period set by a scheduler and an order set by a batch file.

DETAILED DESCRIPTION OF THE INVENTION

Figure 1:
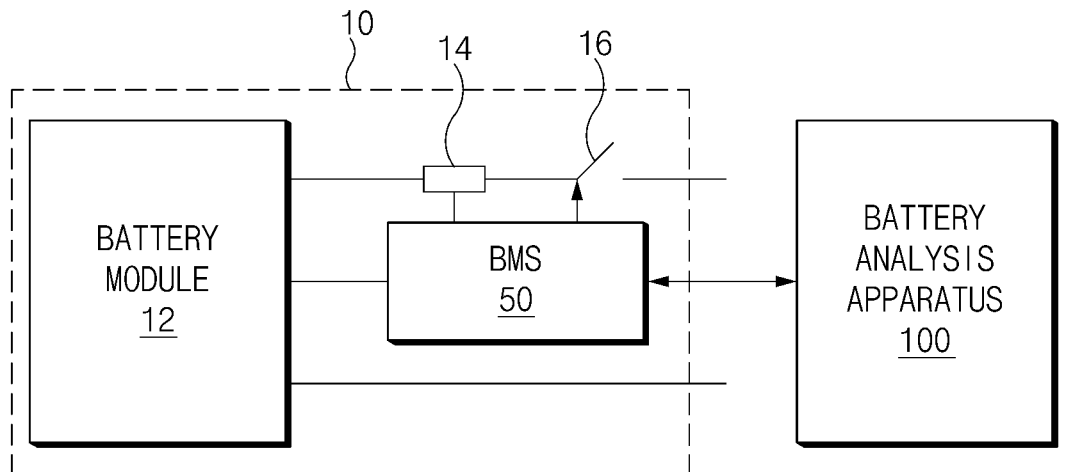
FIG. 1 illustrates a battery pack and a battery analysis apparatus according to an embodiment disclosed herein.

Hereinafter, various embodiments disclosed herein will be described in detail with reference to the accompanying drawings. In this document, identical reference numerals will be used for identical components in the drawings, and the identical components will not be redundantly described.

For various embodiments disclosed herein, specific structural or functional descriptions are only exemplified for the purpose of describing the embodiments, and various embodiments disclosed herein may be implemented in various forms, and should not be construed as being limited to the embodiments described herein.

As used in various embodiments, the terms "$1^{st}$", "$2^{nd}$", "first", "second", or the like may modify various components regardless of importance, and do not limit the components. For example, a first component may be named as a second component without departing from the right scope of an embodiment disclosed herein, and similarly, the second component may be named as the first component.

Terms defined in the present disclosure are used for only describing a specific exemplary embodiment and may not have an intention to limit the scope of other exemplary embodiments. It is to be understood that the singular forms include plural references unless the context clearly dictates otherwise.

All terms including technical and scientific terms used herein have the same meaning as commonly understood by one of ordinary skill in the art to which the embodiments disclosed herein belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein. In some case, terms defined in the present disclosure cannot be analyzed to exclude embodiments disclosed herein.

FIG. 1 illustrates a battery pack and a battery analysis apparatus according to an embodiment disclosed herein.

More specifically, FIG. 1 schematically shows operations of a battery rack 10 and a battery analysis apparatus 100 according to an embodiment disclosed herein.

As shown in FIG. 1, the battery rack 10 may include a plurality of battery modules 12, a sensor 14, a switching unit 16, and a battery management system (BMS) 50. The battery rack 10 may include the battery module 12, the sensor 14, the switching unit 16, and the battery management system 50 provided in plural.

The plurality of battery modules 12 may include one or more chargeable/dischargeable battery cells. In this case, the plurality of battery modules 12 may be connected in series or in parallel.

The sensor 14 may detect current flowing in the battery rack 10. In this case, a detected signal of current may be transmitted to the battery management system 50.

The switching unit 16 may be connected in series to a (+) terminal side or a (−) terminal side of the battery module 12 to control the charging/discharging current flow of the battery module 12. For example, the switching unit 16 may use at least one relay, a magnetic contactor, etc., according to the specifications of the battery rack 10.

The battery management system 50 may monitor the voltage, current, temperature, etc., of the battery rack 10 to perform control and management to prevent overcharging and overdischarging, etc., and may include, for example, a rack BMS (RBMS).

The battery management system 50, which is an interface for receiving measurement values of the above-described various parameter values, may include a plurality of terminals and a circuit, etc., connected thereto to process input values. The battery management system 50 may control on/off of the switching unit 16, e.g., a relay, a contactor, etc., and may be connected to the battery module 12 to monitor the state of each battery module 12.

Meanwhile, the battery management system 50 disclosed herein may collect state data (log data), such as voltage, current, temperature, etc., of the battery module 12 and transmit such data to the battery analysis apparatus 100 through a communication module (not shown), as described below.

Figure 2:
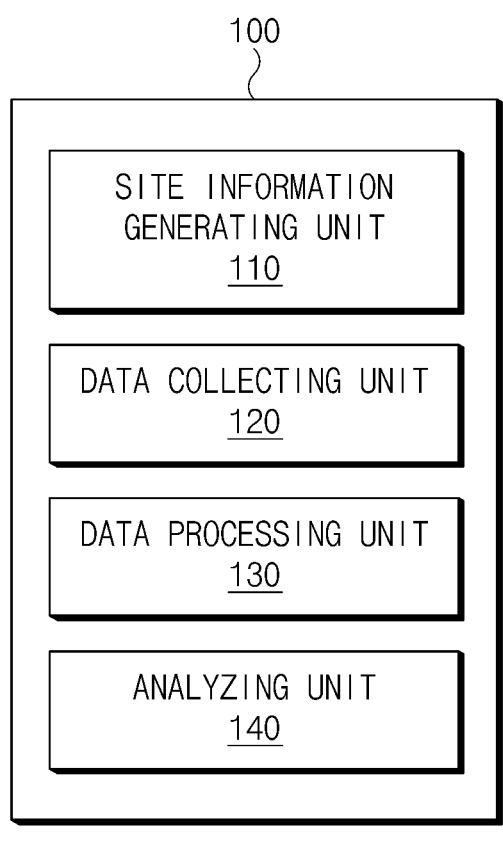
FIG. 2 is a block diagram illustrating a structure of a battery analysis apparatus, according to an embodiment disclosed herein.

FIG. 2 is a block diagram illustrating a structure of a battery analysis apparatus, according to an embodiment disclosed herein.

Referring to FIG. 2, the battery analysis apparatus 100 according to an embodiment disclosed herein may include a site information generating unit 110, a data collecting unit 120, a data processing unit 130, and an analyzing unit 140.

The site information generating unit 110 may generate information of an energy storage system (ESS) site (or ESS site information). For example, the ESS site information may include information about an identification (ID) and a position of an ESS site, and information about the number and a structure of battery cells included in each ESS site. The site information generating unit 110 may automatically update the ESS site information each time when an ESS site is added.

The site information generating unit 110 may generate the ESS site information through a command prompt (CMD) or a batch file. For example, the site information generating unit 110 may generate a database (DB) of the ESS site information (or an ESS site information DB) through a python application programming interface (API). In this case, the site information generating unit 110 may generate a folder for each ESS site's ID and store ESS site information in each folder. This will be described with reference to FIG. 5.

The data collecting unit 120 may collect state data of at least one battery included in an ESS site. For example, the data collecting unit 120 may automatically collect state data of a battery from an ESS site through a batch file. In this case, the state data of the battery may include log data, such as a voltage, a current, a temperature, etc., of a battery cell, measured every second. Moreover, the data collecting unit 120 may collect the state data of the battery from a battery management system that manages a battery rack.

The data processing unit 130 may perform pre-processing on the state data of the battery. For example, the data processing unit 130 may perform pre-processing on the state data of the battery, through time reversal removal, redundant data removal, time unit setting, file format transformation, etc.

Herein, the reversal removal refers to removing an error in which log data about a state of a battery is measured in contrary to a chronological order (e.g., data logging is done in 1 second, 2 seconds, 1 second), and the redundant data removal refers to removing a case where the same data is redundantly measured. Moreover, time unit setting refers to unifying a unit such as identifying the state data of the battery measured every second, by unit of one day, and the file format transformation refers to transforming a csv file into a mat file. However, these schemes are merely examples and a pre-processing method of the battery analysis apparatus according to an embodiment disclosed herein may be various.

Moreover, the data processing unit 130 may perform a preset operation through an auto-running file. For example, the data processing unit 130 may automatically perform pre-processing on the state data of the battery by using a matlab compiler runtime (MCR) file. In this case, the data processing unit 130 may perform an operation such as pre-processing the state data of the battery, etc., by executing an MCR file according to a time and a period that are set by a scheduler and a command and an order that are set by a batch file.

The analyzing unit 140 may analyze a state of the battery based on the state data of the battery. In this case, the analyzing unit 140 may perform a preset operation through an auto-running file. For example, the analyzing unit 140 may automatically analyze the state of the battery by using the MCR file. In this case, the analyzing unit 140 may perform an operation such as analyzing the state of the battery, etc., by executing an MCR file according to a time and a period that are set by a scheduler and a command and an order that are set by a batch file.

The analyzing unit 140 may calculate charging/discharging behaviors of the battery based on the state data of the battery and extract the battery having the charging/discharging behaviors falling out of a reference range to classify an abnormality type. For example, the analyzing unit 140 may diagnose that abnormality occurs in a battery cell or module, based on charging/discharging or idle voltage data of the battery, when a voltage behavior of the battery cell or module is different from those of other battery cells or modules, and classify an abnormality type (e.g., after charging and/or discharging/idle voltage rise or drop, etc.).

As such, the battery analysis apparatus 100 according to an embodiment disclosed herein may process and analyze log data about a state of a battery and automate respective processes in one system, thereby accommodating data increasing with expansion of an ESS site and rapidly and efficiently processing and analyzing the log data of the battery.

Figure 3:
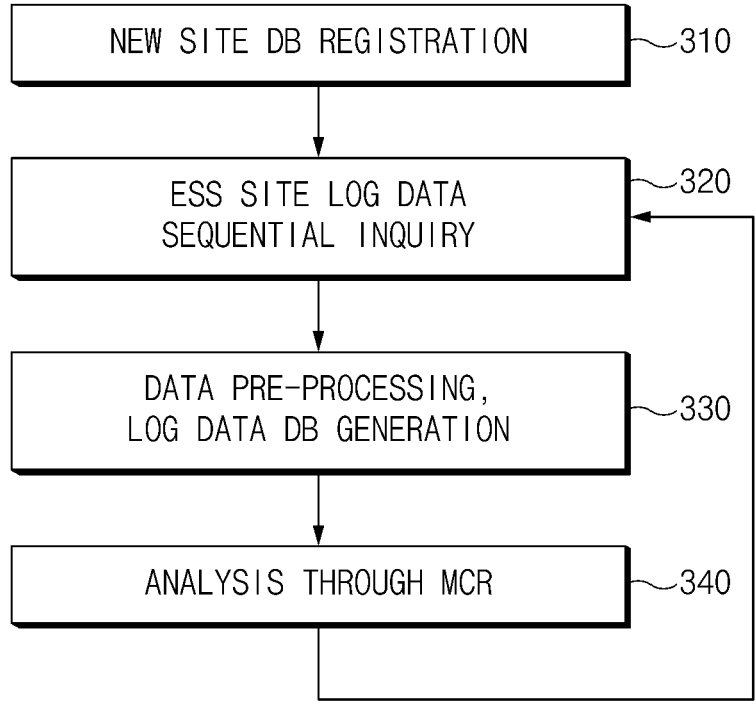
FIG. 3 is a diagram showing operations of a battery analysis apparatus, according to an embodiment disclosed herein.

FIG. 3 is a diagram showing operations of a battery analysis apparatus, according to an embodiment disclosed herein.

Referring to FIG. 3, the battery analysis apparatus according to an embodiment disclosed herein may perform new site DB registration in operation 310, ESS site log data sequential inquiry in operation 320, data pre-processing and log data DB generation in operation 330, and analysis through MCR in operation 340. These operations may be performed in one server PC.

The new site DB registration in operation 310 may refer to generating a DB including information about an ESS site including a battery rack. In this case, the ESS site information DB including the ESS site information may be generated through a python API, and may be automatically updated each time when a new ESS site is registered. The ESS site information DB may include information about a configuration of each ESS site, and may be used to pre-process and analyze the state data of the battery included in each ESS site. The new site DB registration in operation 310 may be performed by the site information generating unit 110 of FIG. 2.

The ESS site log data sequential inquiry in operation 320 refers to sequentially inquiring the state data of the battery included in the ESS site. That is, log data about the state of the battery, e.g., data such as voltage, current, temperature, etc., of a battery cell may be sequentially received for each ESS site from the battery management system that manages the battery rack of the ESS site. The ESS site log data sequential inquiry in operation 320 may be performed by the data collecting unit 120 of FIG. 2.

The data pre-processing and log data DB generation in operation 330 may refer to pre-processing the log data about the state of the battery, received from the ESS site, into an analyzable form and storing the pre-processed state data in a separate DB. In this case, the log data of the battery may be pre-processed by executing a pre-processing MCR file through a scheduler and a batch file. The data pre-processing and log data DB generation in operation 330 may be performed by the data processing unit 130 of FIG. 2.

The analysis through the MCR file in operation 340 may refer to analyzing the state of the battery by executing the analyzing MCR file for the pre-processed log data of the battery through a scheduler and a batch file. Through such state analysis, abnormality, such as under-voltage, over-voltage, abnormal temperature rise, etc., of the battery may be diagnosed. The analysis through the MCR file in operation 340 may be performed by the analyzing unit 140 of FIG. 2.

In addition, as shown in FIG. 3, the ESS site log data sequential inquiry in operation 320, the data pre-processing and log data DB generation in operation 330, and the analysis through the MCR file in operation 340 may be performed repeatedly according to a period (e.g., daily) set by a scheduler.

As such, the battery analysis apparatus 100 according to an embodiment disclosed herein may perform operations, conventionally performed in a distributed manner by a plurality of entities (PCs), in one server PC, and thus a process such as data transmission, download, etc., may be omitted, thereby rapidly and easily performing processing and analysis of data of the battery.

Figure 4:
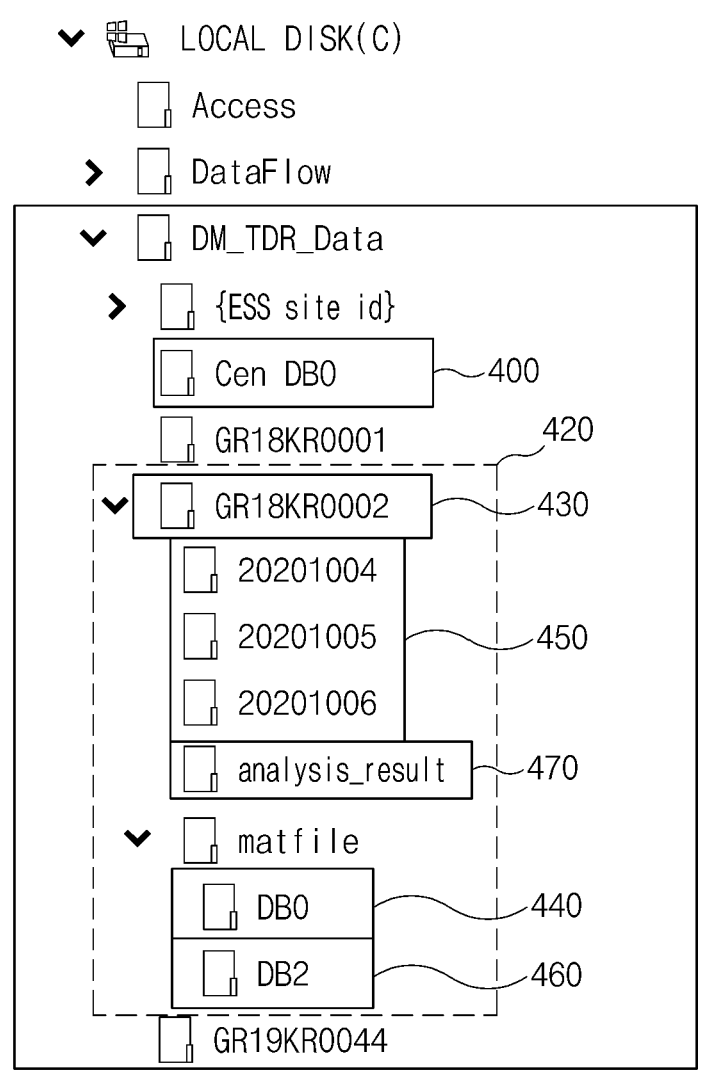
FIG. 4 is a diagram showing a data structure of a battery analysis apparatus, according to an embodiment disclosed herein.

FIG. 4 is a diagram showing a data structure of a battery analysis apparatus, according to an embodiment disclosed herein.

400 of FIG. 4 may indicate a storage folder of a python execution file for generating an ESS site information DB. 420 may indicate an individual folder of an ESS site, in which various data such as information of the ESS site, log data, pre-processed data, an analysis result, etc., may be stored.

In this case, in the individual folder of the ESS site, 430 may indicate an ID of the ESS site, and 440 may indicate an ESS site information DB, in which the ESS site information (e.g., a position of the ESS site, structures and number of batteries, etc.) may be stored. 450 may indicate a folder that stores log data (raw data) indicating state information of a battery provided in an ESS site, in which log data of the battery may be stored by date, and 460 may store data that is a result of pre-processing the log data of the battery. 470 may store information about a result of analyzing the pre-processed log data of the battery.

Figure 5:
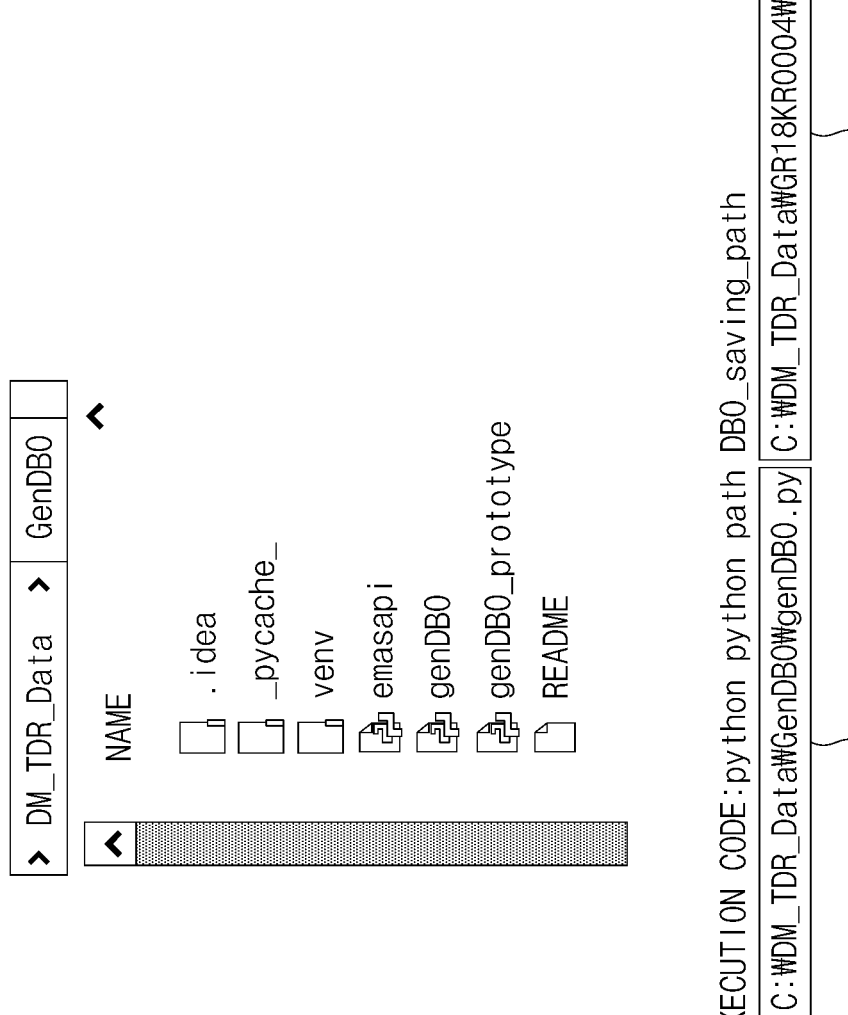
FIG. 5 is a diagram showing operations of a site information generating unit of a battery analysis apparatus according to an embodiment disclosed herein.

FIG. 5 is a diagram showing operations of a site information generating unit of a battery analysis apparatus according to an embodiment disclosed herein.

Referring to FIG. 5, the site information generating unit 110 of the battery analysis apparatus according to an embodiment disclosed herein may automatically input a program execution code together with a factor through a CMD or a batch file. For example, as shown in FIG. 5, for python, a program execution code may be "python/python path/DB0_saving_path".

More specifically, in an example shown in FIG. 5, 510 indicates a python API. 520 indicates a python path that includes a file name and a storage folder of an API, genDB0.py, for generating an ESS site information DB. For example, the python path may be expressed as "C:\DM_TDR_Data\GenDB0\genDB0.py". 530 indicates a DB0_saving path that is a folder path in which DB0 (an ESS site information DB) is stored and a folder may be generated for each ID of an ESS site and ESS site information may be stored for each folder in the form of DB0_summary.mat in the path. For example, the DB0_saving path may be expressed as "C:\DM_TDR_Data\GR18KR0004\matfile\DB0".

In addition, a DB0 generating program shown in FIG. 5 may be executed by generating DB0_summary.mat through a program execution code with an ID of an ESS site each time when the ESS site is newly registered in an EMAS web (a web for managing an ESS site).

Figure 6:
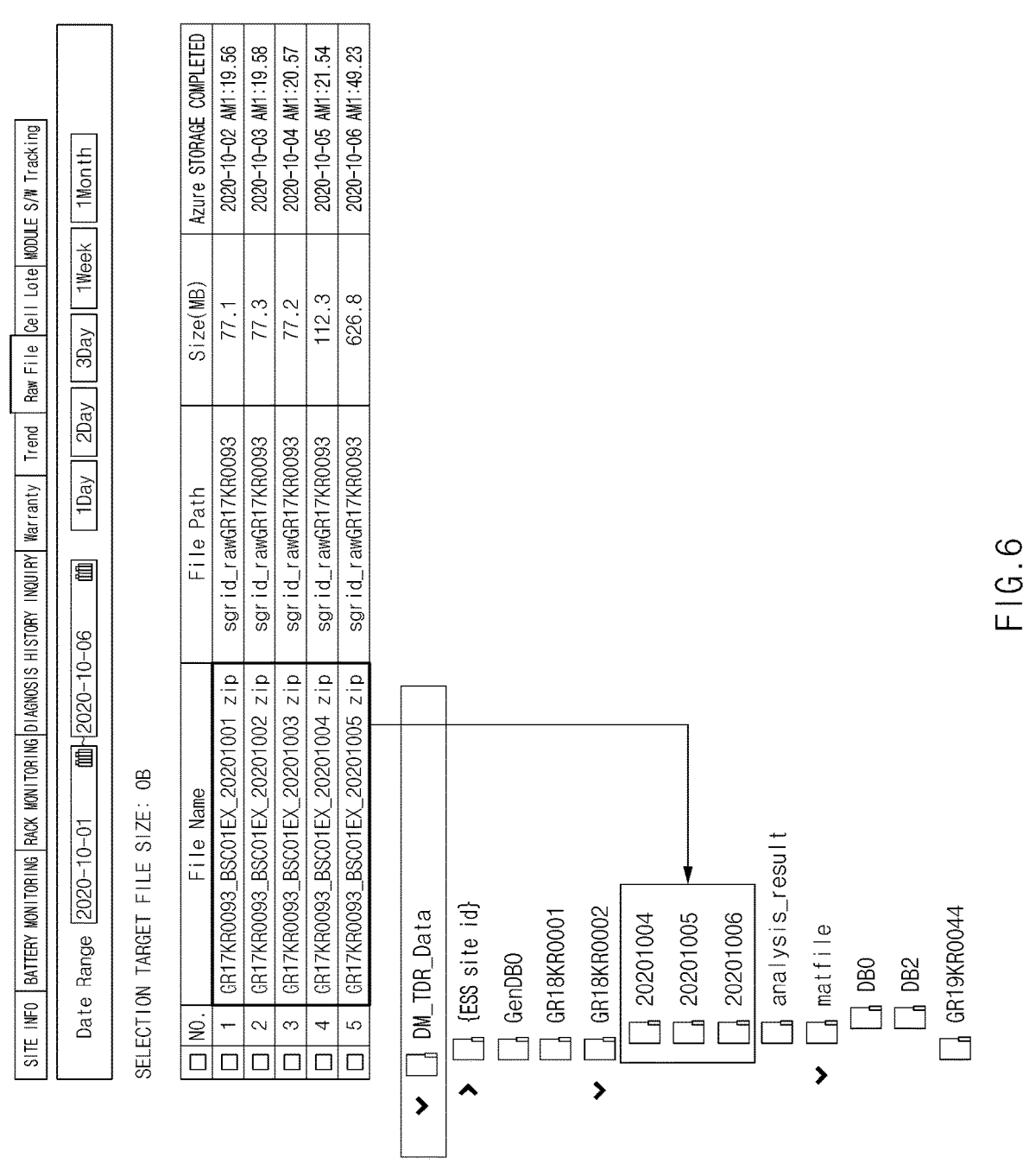
FIG. 6 is a diagram showing operations of a data collecting unit of a battery analysis apparatus according to an embodiment disclosed herein.

FIG. 6 is a diagram showing operations of a data collecting unit of a battery analysis apparatus according to an embodiment disclosed herein.

Referring to FIG. 6, the data collecting unit 120 of the battery analysis apparatus according to an embodiment disclosed herein may automatically inquire and receive log data about a state of a battery, stored for each ESS site, through a batch file. In this case, the log data of the battery may be stored in a battery management system provided for each ESS site. As shown in FIG. 6, the data collecting unit 120 may receive and decompress log data measured every second and stored in the battery management system, and then store the log data by date.

Figure 7:
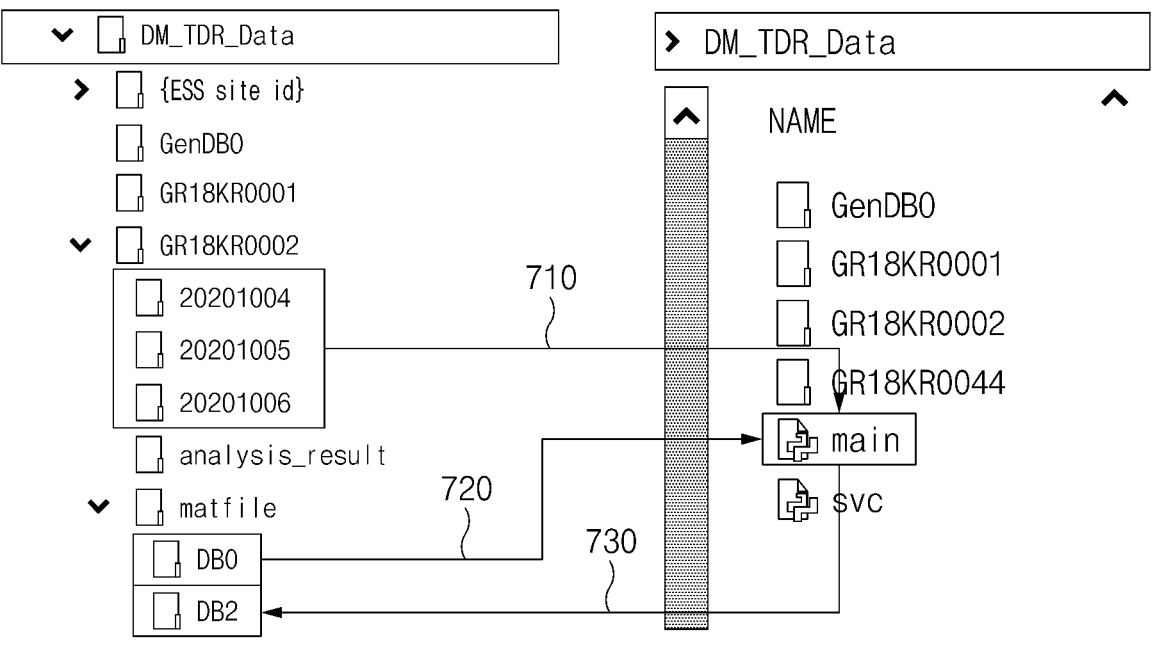
FIG. 7 is a diagram showing operations of a data processing unit of a battery analysis apparatus according to an embodiment disclosed herein.

FIG. 7 is a diagram showing operations of a data processing unit of a battery analysis apparatus according to an embodiment disclosed herein.

Referring to FIG. 7, the data processing unit 130 of the battery analysis apparatus according to an embodiment disclosed herein may retrieve log data of a battery, received from the battery management system of the ESS site, as indicated by 710. From a DB0 folder, ESS site information including the log data may be retrieved, as indicated by 720.

Next, the log data of the ESS site may be pre-processed through a main.exe file and the pre-processed log data may be stored in a DB2 folder, as indicated by 730. For example, pre-processing of the log data may be performed through time reversal removal, redundant data removal, time unit setting, file format transformation, etc. More specifically, the data processing unit 130 may execute a main.exe file stored in a folder of C:\DM_TDR_Data according to a period set by a scheduler and a task and an order that are set by a batch file. In this case, the execution command may be configured in the order of an ID of an ESS site, a site path, a DB0 path, and a DB2 path, in the batch file. For example, the command may be executed by "main.exe GR18KR0018 C:\DM_TDR_Data\GR18KR0018 C:\DM_TDR_Data\GR18KR0018\matfile\DB0 C:\DM_TDR_Data\GR18KR0018\matfile\DB2".

Figure 8:
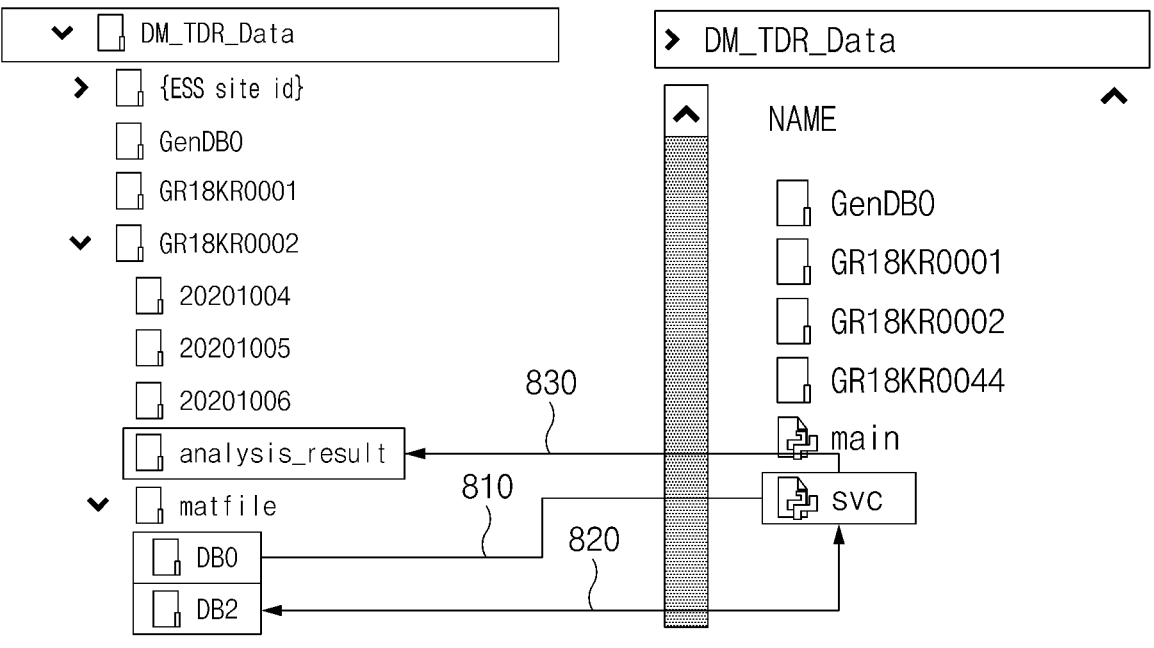
FIG. 8 is a diagram showing operations of an analyzing unit of a battery analysis apparatus according to an embodiment disclosed herein.

FIG. 8 is a diagram showing operations of an analyzing unit of a battery analysis apparatus according to an embodiment disclosed herein.

Referring to FIG. 8, the analyzing unit 140 of the battery analysis apparatus according to an embodiment disclosed herein may retrieve ESS site information from a DB0 folder, as indicated by 810. Pre-processed log data may be retrieved from a DB2 folder, as indicated by 820. The log data of the battery may be analyzed through an swc.exe file and an analysis result may be stored in an analysis.result folder.

More specifically, the analyzing unit 140 may execute the swc.exe file stored in a folder of C:\DM_TDR_Data according to a period set by a scheduler and a task and an order that are set by a batch file. In this case, the execution command may be configured in the order of an ID of an ESS site, a DB0 path, a DB2 path, an output path, and an analysis date, in the batch file. For example, the command may be executed by "swc.exe GR17KR0130 C:\DM_TDR_Data\GR17KR0130 C:\DM_TDR_Data\GR17KR0130\matfile\DB0 C:\DM_TDR_Data\GR17KR0130\matfile\DB2 C:\DM_TDR_Data\GR17KR0130\analysis_result 20200908".

Figure 9:
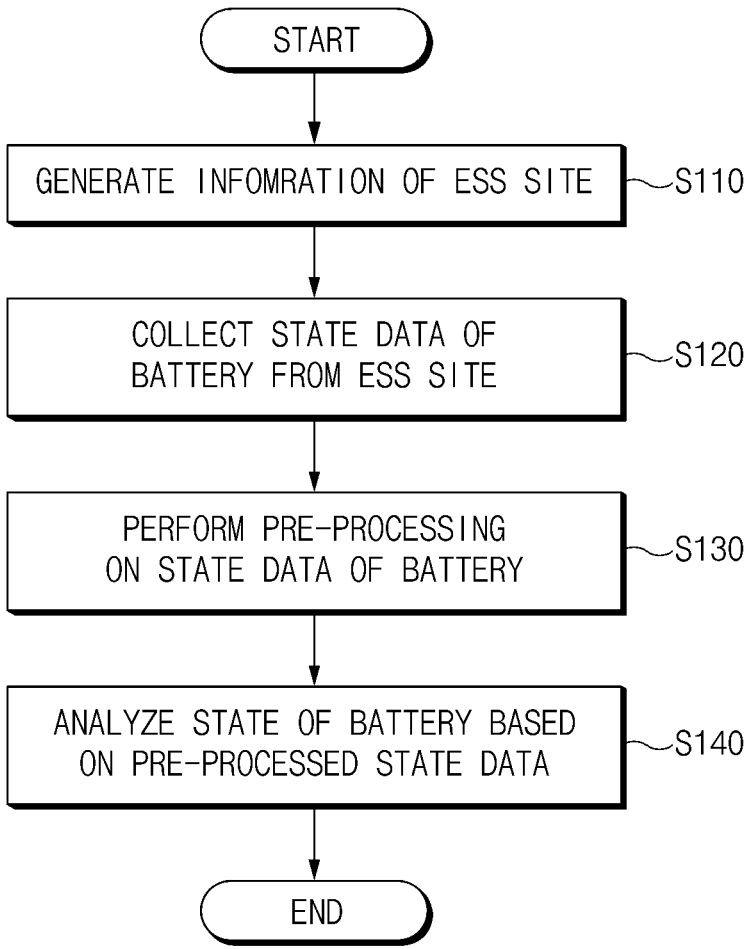
FIG. 9 is a flowchart illustrating a battery analysis method according to an embodiment disclosed herein.

FIG. 9 is a flowchart illustrating a battery analysis method according to an embodiment disclosed herein.

Referring to FIG. 9, a battery analysis method according to an embodiment disclosed herein may generate ESS site information, in operation S110. For example, in operation S110, the ESS site information may be generated through a CMD or a batch file. In this case, a folder for each ESS site's ID may be generated and the ESS site information may be stored in each folder. The ESS site information may be automatically updated each time when an ESS site is added.

The state data of the battery may be collected from the ESS site, in operation S120. For example, the state data of the battery may be automatically collected from the ESS site through the batch file, in operation S120. In this case, the state data of the battery may be collected from a battery management system that manages a battery rack.

Next, pre-processing may be performed on the state data of the battery, in operation S130. For example, in operation S130, pre-processing may be performed on the state data of the battery, through time reversal removal, redundant data removal, time unit setting, file format transformation, etc.

In this case, in operation S130, a preset operation may be performed through an auto-running file. For example, an operation such as pre-processing the state data of the battery, etc., may be performed by executing an MCR file according to a time and a period that are set by a scheduler and a command and an order that are set by a batch file.

In addition, based on the pre-processed state data, the state of the battery may be analyzed in operation S140. In this case, in operation S140, a preset operation may be performed through an auto-running file. In this case, an operation such as analyzing the state of the battery, etc., may be performed by executing an MCR file according to a time and a period that are set by a scheduler and a command and an order that are set by a batch file.

More specifically, in operation S140, charging/discharging behaviors of the battery may be calculated based on the pre-processed state data of the battery, and the battery having the charging/discharging behaviors falling out of a reference range may be extracted to classify an abnormality type. For example, it may be diagnosed that abnormality occurs in a battery cell or module, based on charging/discharging or idle voltage data of the battery, when a voltage behavior of the battery cell or module is different from those of other battery cells or modules, and an abnormality type may be classified.

As such, the battery analysis method according to an embodiment disclosed herein may process and analyze log data about a state of a battery and automate respective processes in one system, thereby accommodating data increasing with expansion of an ESS site and rapidly and efficiently processing and analyzing the log data of the battery.

Figure 10:
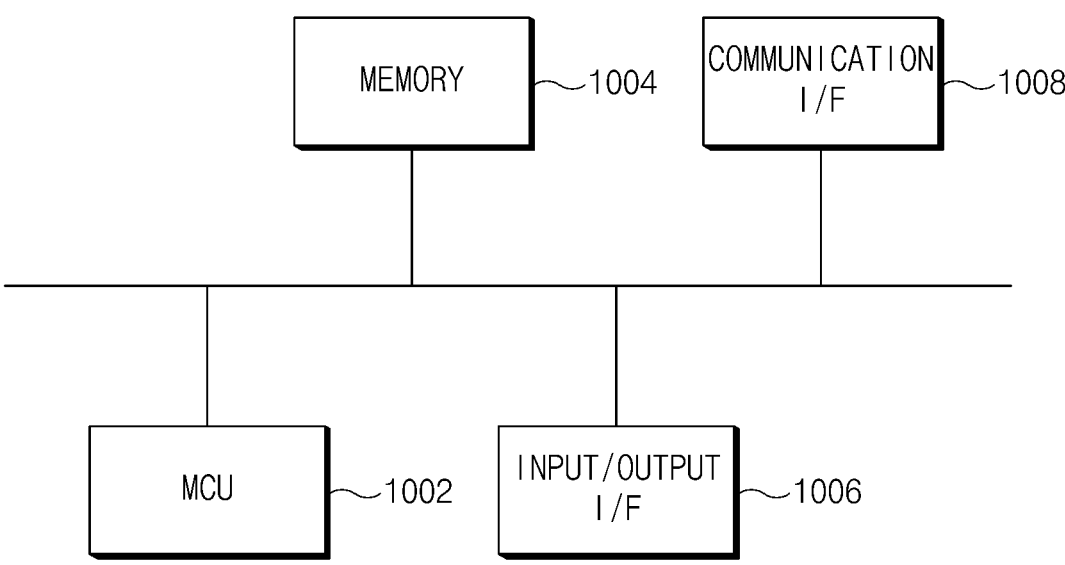
FIG. 10 is a diagram showing a hardware configuration of a computing system for performing a battery analysis method according to an embodiment disclosed herein.

FIG. 10 is a diagram showing a hardware configuration of a computing system for performing a battery analysis method according to an embodiment disclosed herein.

Referring to FIG. 10, a computing system 1000 according to an embodiment disclosed herein may include a micro-controller unit (MCU) 1002, a memory 1004, an input/output interface (I/F) 1006, and a communication I/F 1008.

The MCU 1002 may be a processor that executes various programs (e.g., an ESS site information generating program, a log data pre-processing program, a state analysis program, etc.) stored in the memory 1004, processes various data including ESS site information, log data about a state of a battery, etc., through these programs, and executes the above-described functions of the battery analysis apparatus shown in FIG. 2.

The memory 1004 may store various programs about ESS site information generation and processing and analysis of the data of the battery. The memory 1004 may also store various data such as ESS site information, log data, pre-processed data, an analysis result, etc., of the battery.

The memory 1004 may be provided in plural, depending on a need. The memory 1004 may be a volatile memory or a nonvolatile memory. For the memory 1004 as the volatile memory, random access memory (RAM), dynamic RAM (DRAM), static RAM (SRAM), etc., may be used. For the memory 1004 as the nonvolatile memory, read only memory (ROM), programmable ROM (PROM), electrically alterable ROM (EAROM), erasable PROM (EPROM), electrically erasable PROM (EEPROM), flash memory, etc., may be used. The above-listed examples of the memory 1004 are merely examples and are not limited thereto.

The input/output I/F 1006 may provide an interface for transmitting and receiving data by connecting an input device (not shown) such as a keyboard, a mouse, a touch panel, etc., and an output device such as a display (not shown), etc., with the MCU 1002.

The communication I/F 1008, which is a component capable of transmitting and receiving various data to and from a server, may be various types of devices capable of supporting wired or wireless communication. For example, a program for ESS site information generation and battery state data processing and analysis or various data may be transmitted and received to and from a separately provided external server through the communication I/F 1008.

As such, a computer program according to an embodiment disclosed herein may be recorded in the memory 1004 and processed by the MCU 1002, thus being implemented as a module that performs functions shown in FIG. 2.

The battery analysis apparatus and method according to an embodiment disclosed herein may process and analyze log data about a state of a battery and automate respective processes in one system, thereby accommodating data increasing with expansion of an ESS site and rapidly and efficiently processing and analyzing the log data of the battery.

Even though all components constituting an embodiment disclosed herein have been described above as being combined into one or operating in combination, the embodiments disclosed herein are not necessarily limited to the embodiments. That is, within the object scope of the embodiments disclosed herein, all the components may operate by being selectively combined into one or more.

Moreover, terms such as "include", "constitute" or "have" described above may mean that the corresponding component may be inherent unless otherwise stated, and thus should be construed as further including other components rather than excluding other components. All terms including technical or scientific terms have the same meanings as those generally understood by those of ordinary skill in the art to which the embodiments disclosed herein pertain, unless defined otherwise. The terms used generally like terms defined in dictionaries should be interpreted as having meanings that are the same as the contextual meanings of the relevant technology and should not be interpreted as having ideal or excessively formal meanings unless they are clearly defined in the present document.

The above description is merely illustrative of the present disclosure, and various technical idea of the modifications and variations will be possible without departing from the essential characteristics of embodiments of the present disclosure by those of ordinary skill in the art to which the embodiments disclosed herein pertains. Therefore, the embodiments disclosed herein are intended for description rather than limitation of the technical spirit of the embodiments disclosed herein and the scope of the technical spirit of the present disclosure is not limited by these embodiments disclosed herein. The protection scope of the technical spirit disclosed herein should be interpreted by the following claims, and all technical spirits within the same range should be understood to be included in the range of the present document.

The invention claimed is:

1. A battery system comprising:
a battery management system; and
a battery analysis apparatus comprising:

a site information generator configured to update information on a new energy storage system (ESS) site in addition to information on existing ESS sites through a batch file each time the new ESS site is added;

a data collector configured to collect new battery state data of the new ESS site and latest battery state data of the existing ESS sites through the batch file;

a data processor configured to generate pre-processing data by performing pre-processing on the new battery state data of the new ESS site and the latest battery state data of the existing ESS sites; and an analyzer configured to:

analyze states of batteries included in the new ESS site and the existing ESS sites based on the pre-processing data in an order set out by the batch file, calculate charging and discharging behaviors of the batteries based on the states of the batteries, and extract an abnormal battery having the charging and discharging behaviors falling out of a reference range and classify an abnormality type of the abnormal battery, wherein the battery analysis apparatus is configured to transmit abnormality information including information on the abnormal battery and information on the abnormality type to the battery management system, and wherein the battery management system controls an on and off of a switch connected to the abnormal battery based on the transmitted abnormality information including the information on the abnormal battery and the information on the abnormality type.

2. The battery system of claim 1, wherein the data processor is further configured to perform a preset operation through an auto-running file.

3. The battery system of claim 1, wherein the data processor is further configured to automatically perform the pre-processing on the new battery and latest battery state data of the battery by using a matlab compiler runtime (MCR) file.

4. The battery system of claim 3, wherein the data processor is further configured to perform a preset operation by executing the MCR file according to a period set by a scheduler and the order set by the batch file.

5. The battery system of claim 1, wherein the pre-processing comprises time reversal removal, redundant data removal, and time unit setting.

6. The battery system of claim 1, wherein the analyzer is further configured to perform a preset operation through an auto-running file.

7. The battery system of claim 1, wherein the analyzer is configured to automatically analyze a state of a battery using a matlab compiler runtime (MCR) file.

8. The battery system of claim 7, wherein the analyzer is further configured to perform a preset operation by executing the MCR file according to a period set by a scheduler and the order set by the batch file.

9. The battery system of claim 1, wherein the information on the new ESS site or the information on the existing ESS sites comprises information about a number of batteries included in each ESS site and structures of the batteries included in each ESS site.

10. The battery system of claim 1, wherein the site information generator is further configured to generate a new folder using identification (ID) of the new ESS site and store the information on the new ESS site in the new folder.

11. The battery system of claim 1, wherein the data collector is configured to automatically collect the new battery state data from the new ESS site through the batch file.

12. A battery analysis method comprising:

updating information on a new energy storage system (ESS) site in addition to information on existing ESS sites through a batch file each time the new ESS site is added;

collecting new battery state data of the new ESS site and latest battery state data of the existing ESS sites through the batch file;

generating pre-processing data by performing pre-processing on the new battery state data of the new ESS site and the latest battery state data of the existing ESS sites;

analyzing states of batteries included in the new ESS site and the existing ESS sites based on the pre-processing data in an order set out by the batch file;

calculating charging and discharging behaviors of the batteries based on the states of the batteries;

extracting an abnormal battery having the charging and discharging behaviors falling out of a reference range and classifying an abnormality type of the abnormal battery; and controlling an on and off of a switch connected to the abnormal battery by a battery management system based on transmitted abnormality information including information on the abnormal battery and information on the abnormality type.

13. The battery analysis method of claim 12, wherein the generating the pre-processing data and the analyzing the states of the batteries comprise performing a preset operation through an auto-running file.

14. The battery analysis method of claim 12, wherein the generating the pre-processing data comprises automatically performing the pre-processing on the new battery state data and the latest battery state data by using a matlab compiler runtime (MCR) file, and wherein the analyzing the states of the batteries comprises automatically analyzing the states of the batteries by using the MCR file.

15. The battery analysis method of claim 14, wherein the generating the pre-processing data and the analyzing the states of the batteries comprise performing a preset operation by executing the MCR file according to a period set by a scheduler and the order set by the batch file.

* * * * *